(12) United States Patent  
Shigaki et al.

(10) Patent No.: US 8,872,749 B2
(45) Date of Patent: Oct. 28, 2014

(54) DISPLAY DEVICE

(75) Inventors: Takumi Shigaki, Mobara (JP); Hideo Sato, Hitachi (JP); Masahiro Maki, Mobara (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1334 days.

(21) Appl. No.: 12/155,981

(22) Filed: Jun. 12, 2008

(65) Prior Publication Data

US 2008/0316156 A1 Dec. 25, 2008

(30) Foreign Application Priority Data

Jun. 13, 2007 (JP) ................................. 2007/156054

(51) Int. Cl.
*G09G 3/36* (2006.01)
*G11C 19/18* (2006.01)

(52) U.S. Cl.
CPC ............ *G11C 19/184* (2013.01); *G09G 3/3674* (2013.01); *G09G 2310/0286* (2013.01)
USPC .............................. 345/100; 345/204; 345/87

(58) Field of Classification Search
USPC ............. 345/204, 208–209, 211, 214, 55, 87, 345/98–100; 377/64
See application file for complete search history.

(56) References Cited

U.S. PATENT DOCUMENTS

| | | | | |
|---|---|---|---|---|
| 4,413,283 A * | 11/1983 | Aoki et al. | ...................... | 348/304 |
| 6,181,312 B1 * | 1/2001 | Sekine | ............................ | 345/98 |
| 6,845,140 B2 * | 1/2005 | Moon et al. | ...................... | 377/78 |
| 7,038,651 B2 * | 5/2006 | Nitta et al. | ........................ | 345/98 |
| 7,167,154 B2 * | 1/2007 | Sato et al. | ...................... | 345/100 |
| 7,289,096 B2 * | 10/2007 | Jeon et al. | ...................... | 345/100 |
| 7,486,268 B2 * | 2/2009 | Jang et al. | ...................... | 345/100 |
| 7,486,269 B2 * | 2/2009 | Moon | ........................... | 345/100 |
| 7,692,620 B2 * | 4/2010 | Horibata et al. | ............... | 345/100 |
| 7,733,320 B2 * | 6/2010 | Yamaguchi et al. | ........... | 345/100 |
| 7,777,711 B2 * | 8/2010 | Horibata et al. | ............... | 345/100 |
| 7,859,507 B2 * | 12/2010 | Jang et al. | ...................... | 345/100 |
| 2004/0189584 A1 * | 9/2004 | Moon | ........................... | 345/100 |
| 2004/0189681 A1 | 9/2004 | Itakura et al. | | |
| 2006/0139293 A1 * | 6/2006 | Cho | .............................. | 345/100 |
| 2007/0080922 A1 * | 4/2007 | Nakao et al. | .................. | 345/100 |
| 2007/0132703 A1 * | 6/2007 | Sehata et al. | .................. | 345/100 |
| 2007/0195053 A1 * | 8/2007 | Tobita et al. | ................... | 345/100 |

FOREIGN PATENT DOCUMENTS

JP 2004-252092 2/2003

* cited by examiner

*Primary Examiner* — Jason Mandeville
(74) *Attorney, Agent, or Firm* — Juan Carlos A. Marquez; Bacon & Thomas PLLC

(57) ABSTRACT

A shift register circuit has a plurality of shift pulse generation circuits, and a scanning voltage generation circuit has a plurality of base circuits. The base circuits are presented with a first shift pulse generated by a shift pulse generation circuit, and a scanning line clock. The base circuits have a first transistor in which the first shift pulse is input to a first electrode, and a first power supply voltage is input to a control electrode; and a second transistor in which a control electrode is connected to a second electrode in the first transistor, a scanning line clock is input to the first electrode, and the second electrode is connected to a scanning voltage output terminal. The base circuits output a selected scanning voltage synchronized with the scanning line clock from the scanning voltage output terminal when the first shift pulse is at a first voltage level.

12 Claims, 19 Drawing Sheets

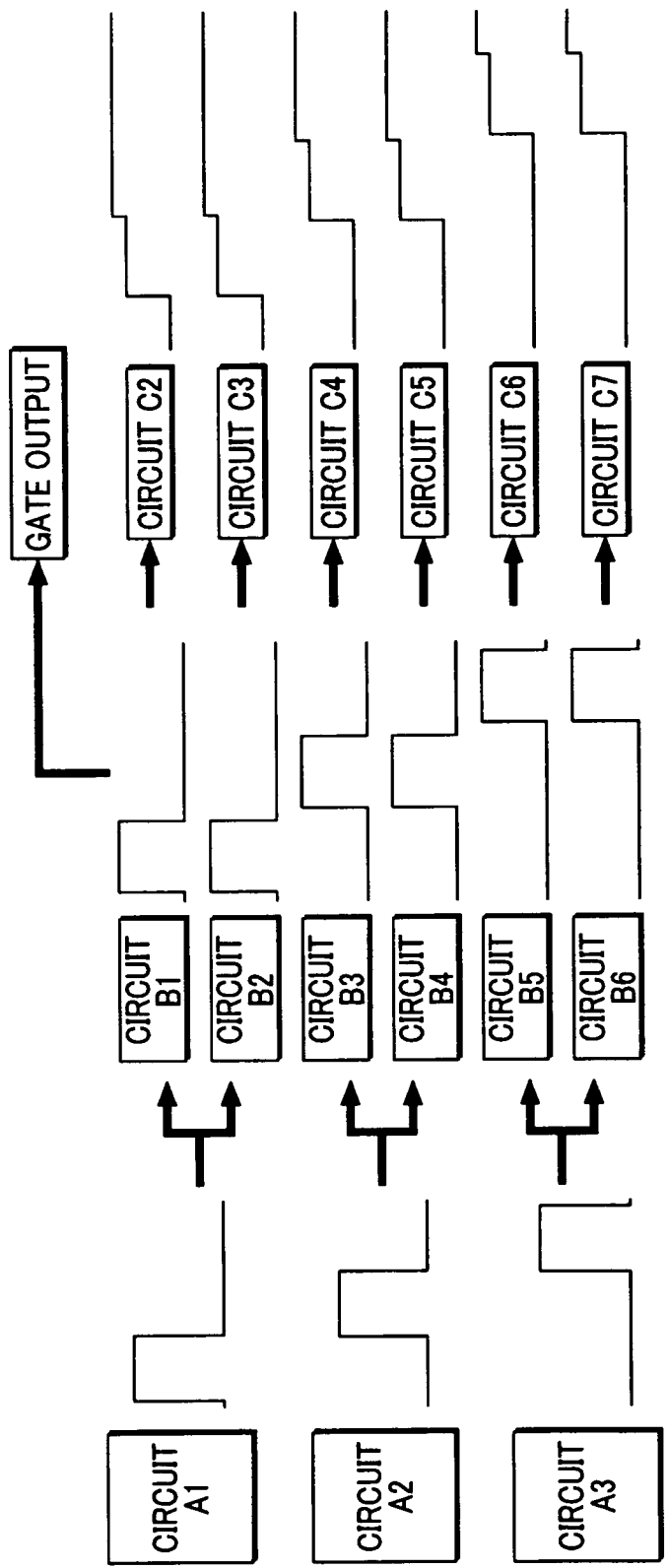

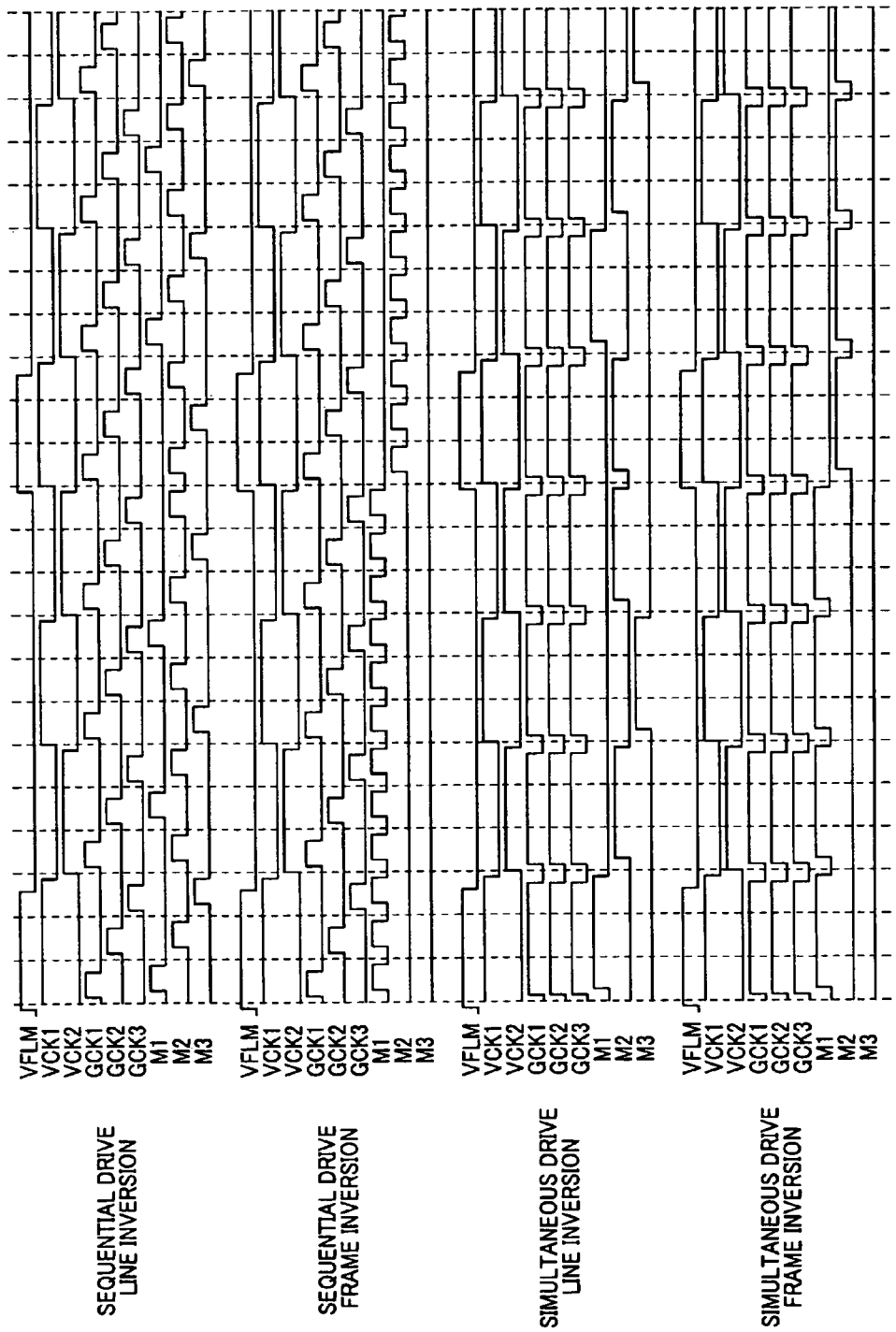

DISPLAY DEVICE

CROSS-REFERENCE TO RELATED APPLICATION

The present application claims priority from Japanese application JP2007-156054 filed on Jun. 13, 2007, the content of which is hereby incorporated by reference into this application.

BACKGROUND OF THE INVENTION

1. Field of the Invention

The present invention relates to a display device, and in particular relates to a display device that is capable of switching between driving scan lines either simultaneously as a plurality or individually in sequence.

2. Description of the Related Art

Thin film transistor (TFT) liquid crystal display modules are widely used in display devices of notebook personal computers and the like. In particular, liquid crystal display modules provided with small-size liquid crystal display panels are used as display devices in portable devices such as portable telephones, for example, that are carried constantly.

If a liquid crystal display panel with VGA resolution (640×3×480) is used in a liquid crystal display module used in such a portable device, the displayed content must be rendered at VGA resolution, which has a high clock frequency during operation, even when QVGA (320×3×240) resolution would be adequate. Thus, power is wastefully consumed, which is a problem.

To that end, a liquid crystal display device provided with a scanning line drive circuit capable of selecting between drive methods corresponding to VGA resolution and QVGA resolution was described in JP-A 2004-252092.

SUMMARY OF THE INVENTION

However, the scanning line drive circuit described in JP-A 2004-252092 is composed of a CMOS circuit. CMOS circuits have problems in that the number of manufacturing processes increases and costs rise.

The present invention resolves the problems in the related art. An object of the present invention is to provide a display device in which the scanning line drive circuit is composed of single-channel elements and costs are reduced.

This and other objects and novel features of the present invention will be explicated through the descriptions and appended drawings in this specification.

The following section briefly explains an overview of a representative example of the invention as disclosed in this application.

The display device according to the present invention comprises a plurality of pixels; a plurality of scanning lines for supplying a scanning voltage to the plurality of pixels; and a scanning line drive circuit; wherein the scanning line drive circuit has a shift register circuit and a scanning voltage generation circuit for generating a scanning voltage; the shift register circuit has a plurality of shift pulse generation circuits for generating a first shift pulse; the scanning voltage generation circuit has a plurality of base circuits; a first shift pulse generated by the shift pulse generation circuit provided in the shift register circuit and corresponding to each of the base circuits and a scanning line clock are input into the each of the base circuits in the scanning voltage generation circuit; the base circuits in the scanning voltage generation circuit have a first transistor in which the first shift pulse generated by the shift pulse generation circuit provided in the shift register circuit and corresponding to each of the base circuits is input to a first electrode, and a first power supply voltage is input to a control electrode, and a second transistor in which a control electrode is connected to a second electrode in the first transistor, the scanning line clock is input to the first electrode, and the second electrode is connected to a scanning voltage output terminal; and each of the base circuits output a selected scanning voltage synchronized with the scanning line clock from the scanning voltage output terminal when the first shift pulse that has been input is at a first voltage level.

According to another aspect of this invention, a first capacitor may be provided between the control electrode of the second transistor and the second electrode of the second transistor.

According to yet another aspect of this invention, a configuration may be adopted in which each of the shift pulse generation circuits in the shift register circuit generate a second shift pulse whose phase differs from that of the first shift pulse; the base circuits in the scanning voltage generation circuits further have a third transistor in which the second shift pulse generated by the shift pulse generation circuit provided in the shift register circuit and corresponding to each of the base circuits is input to a control electrode, a second power supply voltage having a voltage level that is different from that of the first power supply voltage is input to a first electrode, and a second electrode is connected to the scanning voltage output terminal, and a second capacitor connected between the control electrode of the third transistor and the first electrode of the third transistor; and each of the base circuits keep potential of the scanning voltage output terminal at the voltage level of the second power supply voltage when the second shift pulse that has been input is at the first voltage level.

According to still another aspect of this invention, a configuration may be adopted in which the scanning line drive circuit has a common voltage generation circuit for presenting each of common electrodes with a first common voltage or a second common voltage having a voltage level that differs from that of the first common voltage, on the basis of a common electrode drive pulse output from each of the base circuits of the scanning voltage generation circuit; the base circuits of the scanning voltage generation circuit further have a fourth transistor in which a control electrode is connected to the control electrode of the second transistor, a first electrode is connected to the first electrode of the second transistor, and a second electrode is connected to a common electrode drive pulse output terminal; and each of the base circuits output the common electrode drive pulse synchronized to the scanning line clock from the common electrode drive pulse output terminal when the first shift pulse that has been input is at the first voltage level.

According to still another aspect of this invention, a configuration may be adopted in which the scanning line drive circuit has a common voltage generation circuit for presenting each of common electrodes with a first common voltage or a second common voltage having a voltage level that differs from that of the first common voltage, on the basis of a common electrode drive pulse output from each of the base circuits of the scanning voltage generation circuit; the base circuits of the scanning voltage generation circuit further have a fourth transistor in which a control electrode is connected to the control electrode of the second transistor, a first electrode is connected to the first electrode of the second transistor, and a second electrode is connected to a common electrode drive pulse output terminal, and a fifth transistor in which a control electrode is connected to the control electrode of the third transistor, a first electrode is connected to the first electrode of the third transistor, and a second electrode is connected to the common electrode drive pulse output terminal; and each of the base circuits output the common electrode drive pulse synchronized to the scanning line clock from the common electrode drive pulse output terminal when the first shift pulse that has been input is at the first voltage level, and hold the potential of the common electrode drive pulse output terminal at the voltage level of the second power voltage when the second shift pulse that has been input is at the first voltage level.

According to still another aspect of this invention, n base circuits of the scanning voltage generation circuit may be provided to each of the shift pulse generation circuits in the shift register circuit, where n is an integral number of 2 or greater; and first to nth scanning line clocks may be input respectively to the n base circuits in the scanning voltage generation circuit.

According to still another aspect of this invention, a configuration may be adopted in which n common voltage generation circuits and n base circuits of the scanning voltage generation circuit are provided with respect to each of the shift pulse generation circuits in the shift register circuit, where n is an integral number of 2 or greater; first to nth scanning line clocks are respectively input into the n base circuits in the scanning voltage generation circuit; first to nth AC signals are input respectively into the n common voltage generation circuits; and the nth common voltage generation circuit has a circuit C1 for taking in the nth AC signal on the basis of the common electrode drive pulse output from the nth base circuit in the scanning voltage generation circuit, and a circuit C2 for outputting the first common voltage or the second common voltage to a common electrode corresponding to the nth common voltage generation circuit on the basis of the AC signal taken in by the circuit C1.

According to still another aspect of this invention, the phase of the scanning line clock may be changed, and the scanning lines may be driven either simultaneously in a plurality or one-by-one in sequence.

According to still another aspect of this invention, the phase and cycle of the AC signal may be changed, and a switch may be made between 1-line inversion AC drive method and frame inversion AC drive method.

The following briefly describes the effect that can be obtained from a representative example of the invention as disclosed in this application.

According to the display device of the invention, the scanning line drive circuit has single-channel elements, thereby allowing costs to be reduced.

BRIEF DESCRIPTION OF THE DRAWINGS

FIG. 18 is a diagram showing the selected scanning voltage applied to the gate line and the common voltage applied to the common line in the case when the frame inversion AC drive method is employed under multiple gate line simultaneous drive; and FIG. 19 is a diagram showing the waveform of scan line clocks (GCK1, GCK2, GCK3) and AC signals (M1, M2, M3) in the case when three circuits B in the scanning voltage generation circuit are connected to the circuits A in the shift register circuit shown in FIG. 2.

DETAILED DESCRIPTION OF THE INVENTION

The following section describes in detail an embodiment of this invention in reference to drawings.

In all the drawings intended to describe the embodiment, items having the same function are assigned the same reference symbols, and repetitious descriptions are omitted.

Figure 1:
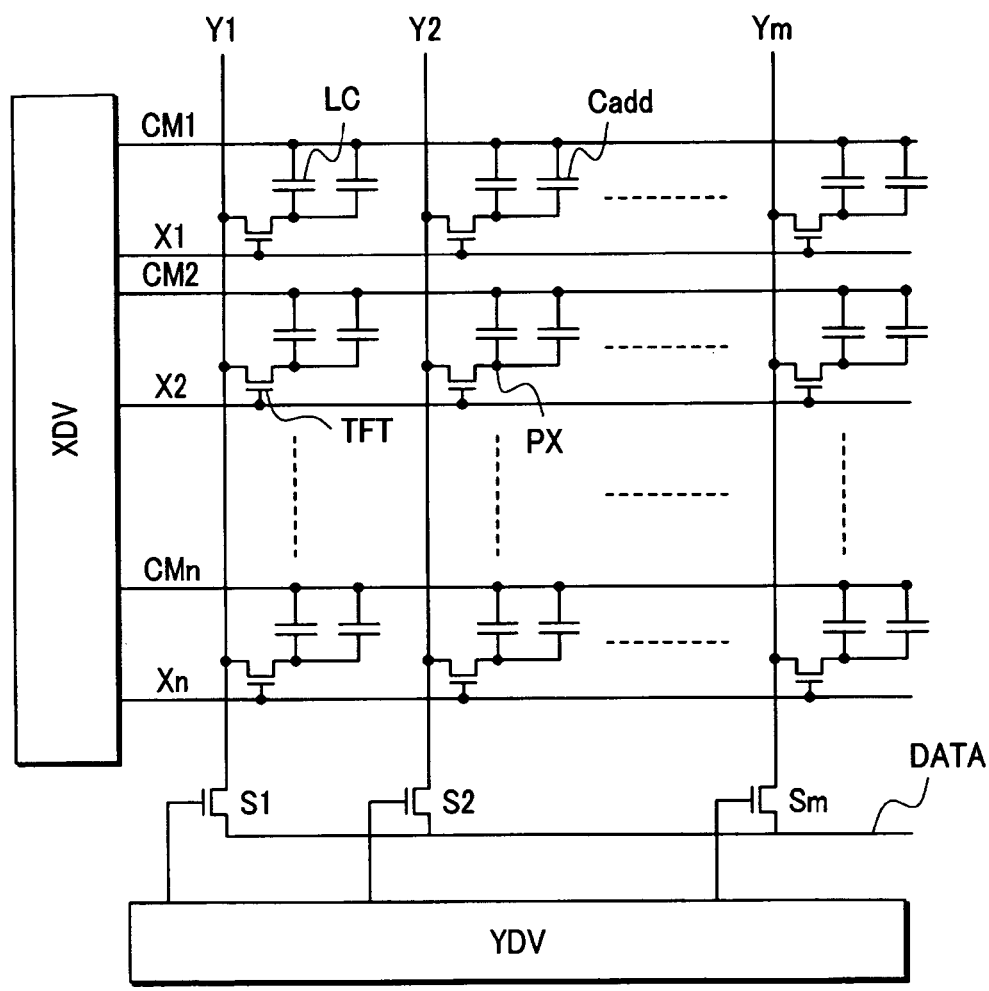
FIG. 1 is a circuit diagram showing an equivalent circuit in an active matrix liquid crystal display module according to an embodiment of this invention.

FIG. 1 is a circuit diagram showing an equivalent circuit in the active matrix liquid crystal display module in an embodiment of this invention.

As shown in FIG. 1, the active matrix liquid crystal display module in this embodiment is an active matrix liquid crystal display module using an in-plane switching (IPS) liquid crystal display panel. The module has a pair of substrates facing mutually via the liquid crystal. On the liquid crystal surface of one of the substrates, there are n gate lines (G1, G2, ..., Gn) extending in the x direction, n common lines (also referred to as common electrodes) (CM1, CM2, ..., CMn) extending in the x direction, and m drain lines (Y1, Y2, ..., Ym) extending in the y direction intersecting with the x direction.

The area surrounded by gate lines (also referred to as scanning lines) and drain lines (also referred to as picture lines) is the pixel area. For each pixel area is disposed a pixel transistor (TFT) with a gate connected to the gate line, a drain (or source) connected to the drain line, and a source (or drain) connected to the pixel electrode (PX). Furthermore, a liquid crystal capacitance (LC) and a holding capacitance (Cadd) are disposed between the pixel electrode and the common lines (CM1, CM2, ..., CMn).

The gate lines (G1, G2, ..., Gn) are connected to a vertical drive circuit (the scanning line drive circuit in this embodiment) (XDV), while the vertical drive circuit (XDV) sequentially supplies a selected scan signal to the gate lines from X1 to Xn (or from Xn to X1).

Common lines (CM1, CM2, ..., CMn) are connected to the vertical drive circuit (XDV), while the vertical drive circuit (XDV) performs AC driving for the voltage applied to the common lines CM1 to CMn (or CMn to CM1) by sequentially switching polarity.

Drain lines (Y1, Y2, ..., Ym) are connected to the drains (or the sources) of switch elements (S1, S2, ..., Sm).

The sources (or drains) of switch elements (S1, S2, ..., Sm) are connected to a picture signal lines (DATA lines), while the gates are connected to a horizontal drive circuit (YDV). The horizontal drive circuit (YDV) sequentially scans the switch elements in the switch element direction from S1 to Sm (or Sm to S1).

Figure 2:
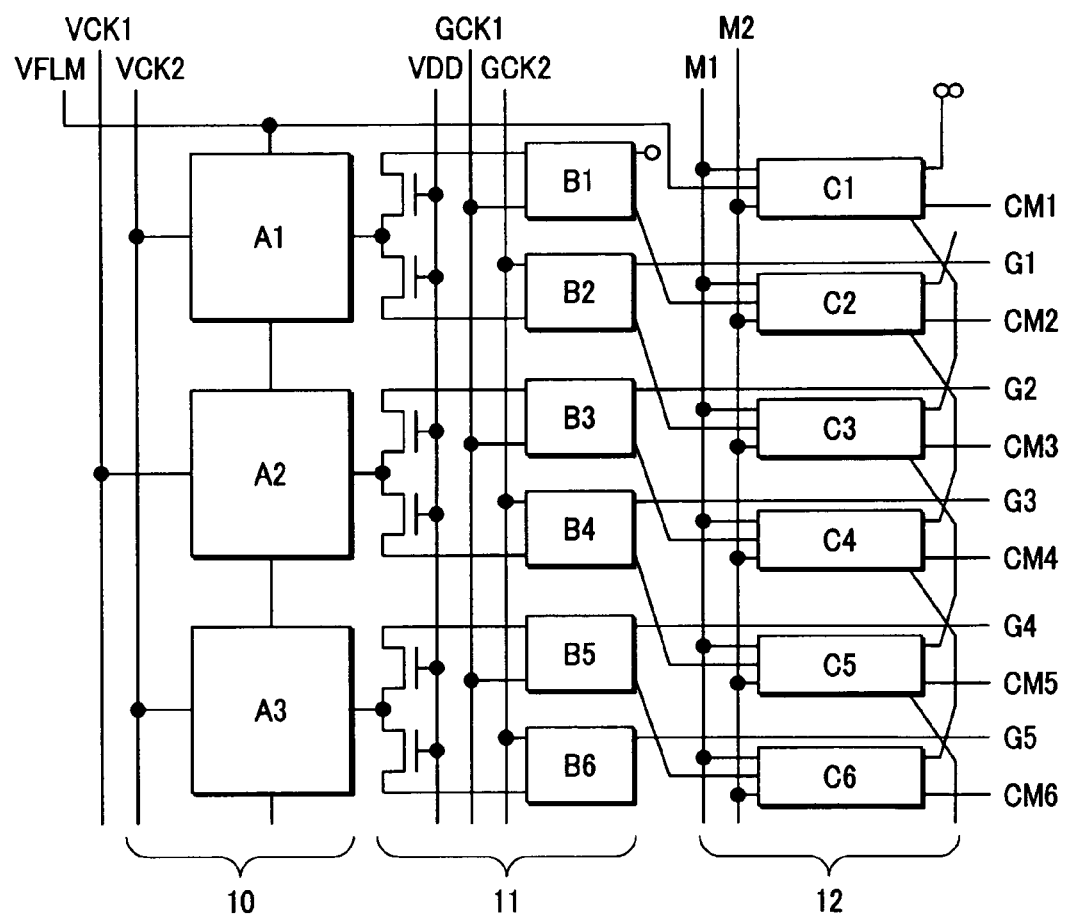
FIG. 2 is a block diagram showing the schematic configuration of the vertical drive circuit (XDV) shown in FIG. 1.

The following section describes the vertical drive circuit (XDV) shown in FIG. 1. FIG. 2 is a block diagram showing the schematic configuration of the vertical drive circuit (XDV) shown in FIG. 1. The vertical drive circuit (XDV) shown in FIG. 1 has a shift register circuit 10, a scanning voltage generation circuit 11, and a common voltage generation circuit 12.

Circuit A in FIG. 2 is one of the circuit units that constitute the shift register circuit 10. The circuit A transmits signals sequentially to the next level circuit.

Circuit B is one of the circuit units that constitute the scanning voltage generation circuit 11. The circuit B outputs the selected scanning voltage to the gate lines (G1, G2, ..., Gn) and provides on/off control for the pixel transistor (TFT).

Circuit C is one of the circuit units that constitute the common voltage generation circuit 12. The circuit C outputs a positive polarity common voltage (VCOMH) or a negative polarity common voltage (VCOML) to the common lines (CM1, CM2, ..., CMn).

In this specification, "positive polarity" in "positive polarity common voltage" (VCOMH) signifies higher potential than the voltage applied to the pixel electrode (PX). The voltage may be either greater than or lesser than 0 V. Similarly, "negative polarity" in "negative polarity common voltage" (VCOML) signifies lower potential than the voltage applied to the pixel electrode (PX). The voltage may be either greater than or lesser than 0 V.

Figure 3:
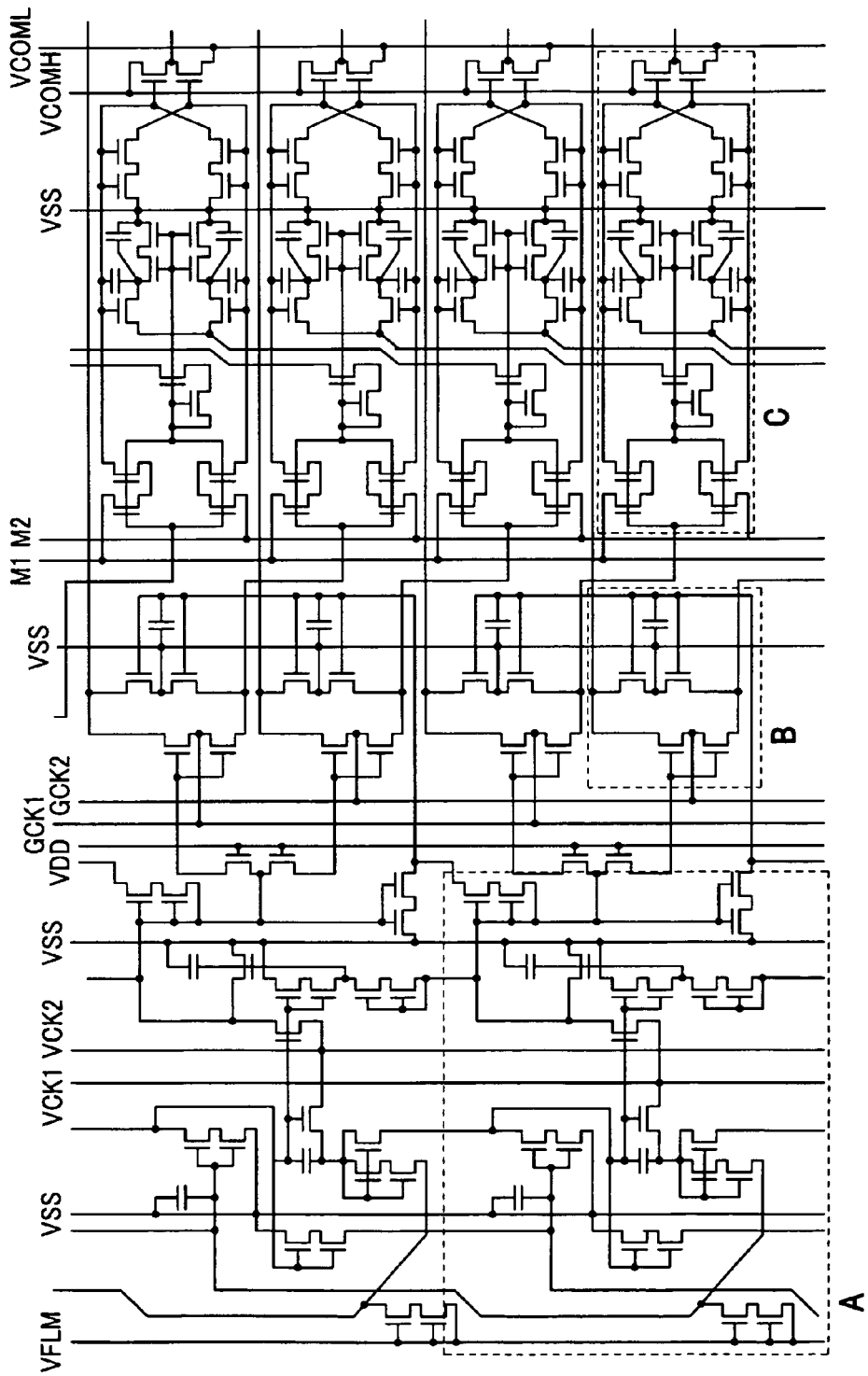
FIG. 3 is a circuit diagram showing the actual circuit configuration of a shift register circuit, a scanning voltage generation circuit, and a common voltage generation circuit shown in FIG. 2.

FIG. 3 presents circuit diagrams showing the actual circuit configuration of the shift register circuit 10, the scanning voltage generation circuit 11, and the common voltage generation circuit 12 as shown in FIG. 2. The area enclosed in a dotted line in FIG. 3 indicates the 3 circuit units (A, B, C) shown in FIG. 2, respectively.

The shift register circuit 10 as shown in FIG. 2 has the circuits A as base circuits arrayed vertically in n levels.

Figure 4:
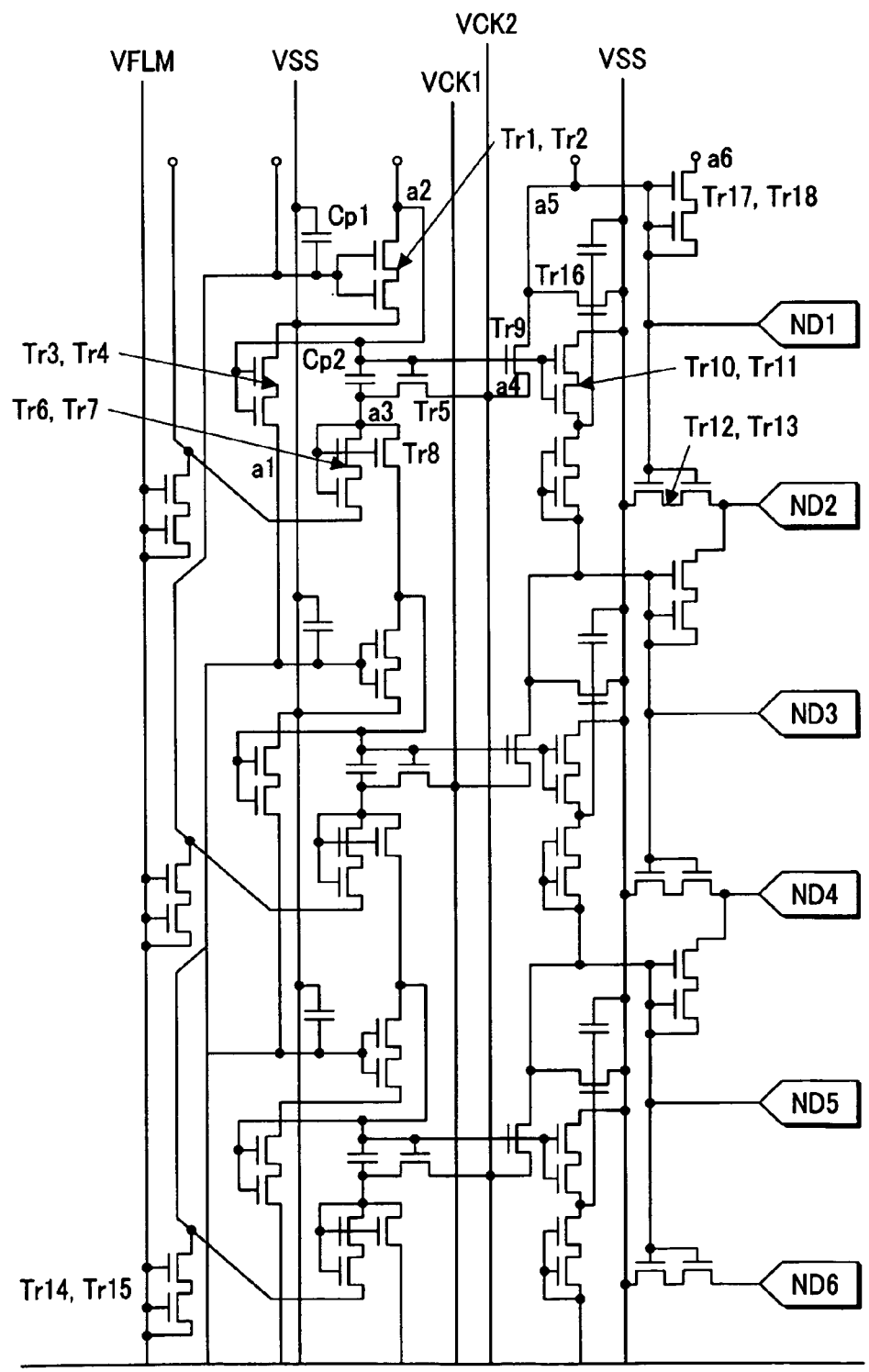
FIG. 4 is a circuit diagram showing the circuit configuration of circuits A as the base circuits in the shift register circuit shown in FIG. 2.
Figure 5:
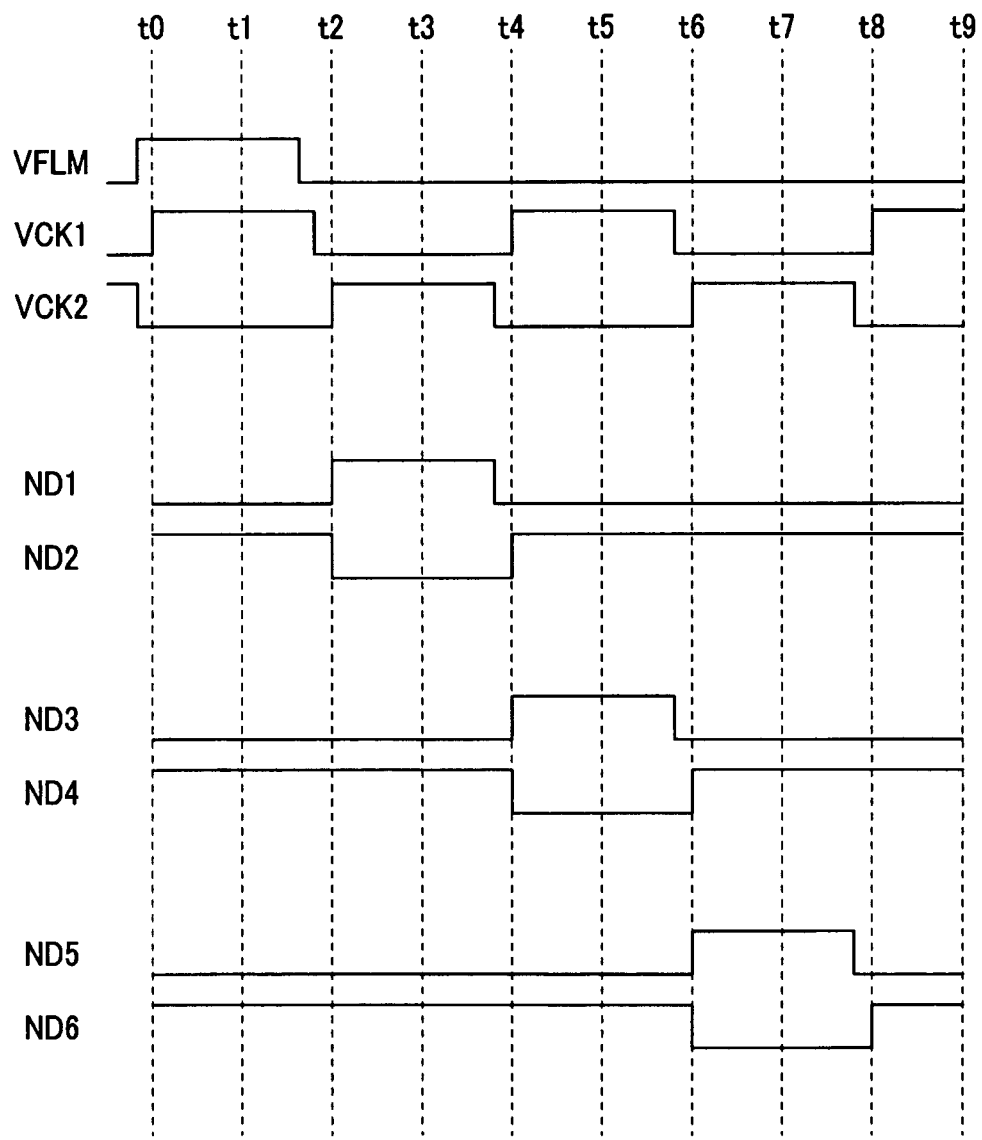
FIG. 5 is a timing chart showing the waveform of a input signal and clocks input to the circuit in FIG. 4, and of shift pulses output from the circuit in FIG. 4.

FIG. 4 is a circuit diagram showing the circuit configuration of the circuits A as base circuits in the shift register circuit 10 shown in FIG. 2. In addition, FIG. 5 is a timing chart showing the waveform of a input signal input into the circuit in FIG. 4, of clocks, and shift pulses output from the circuit in FIG. 4.

In FIG. 4, VFLM is a vertical start pulse. Also, clocks VCK1 and VCK2 are shift clocks. In this embodiment, the shift clock (VCK2) is input to odd-numbered circuit A nodes (a4), while the shift clock (VCK1) is input to even-numbered circuit A nodes (a4).

When the vertical start pulse in FIG. 4 (VFLM) is input, type-n MOS transistors (Tr14, Tr15) (referred to hereafter simply as "transistors") of the circuit A turn on, while the node (a1) goes to High level (hereafter, "H level") (in other words, VDD power voltage). Because of this, transistors (Tr1, Tr2) turn on, and the node (a2) goes to Low level (hereafter, "L level") (in other words, VSS power voltage, which has lower potential than VDD).

Until the voltage is applied to the node (a2) of the previous level and the transistors (Tr3, Tr4) turn on, the voltage of the node (a1) is maintained by a capacitor (Cp1). The vertical start pulse (VFLM) is supplied to the first circuit A node (a2). Since the vertical start pulse (VFLM) is also input into the gates of the first circuit A transistors (Tr3, Tr4), once the vertical start pulse (VFLM) is input, the first circuit A node (a1) changes to the L level.

When the voltage output from previous-level circuit A (in other words, the voltage output from transistor (Tr8) in previous-level circuit A) is input to the node (a2), the transistors (Tr3 to Tr5, Tr9 to Tr11) turn on, and a charge accumulates in an electrostatic capacitor (Cp2). The transistors (Tr10, Tr11) turn on, and the node (a5) in the next-level circuit A is set to L level.

The transistors (Tr3, Tr4) turn on, and the node (a1) in the circuit A changes to the L level. The transistors (Tr1, Tr2) in the next-level circuit A accordingly turn off; therefore, the next-level node (a2) in the circuit A goes into a floating state.

In this state, when the H level of the clock (VCK2) is input to node (a4) at, for example, the time (t2) in FIG. 5, transistor (Tr5) is in an "on" state. Accordingly, voltage is applied to the node (a3), and voltage is applied to the capacitor (Cp2) and the gate and drain of the transistors (Tr6, Tr7, Tr8).

The node (a2) in the next-level circuit A is in the floating state, and so when voltage is applied to the node (a3), the voltage of the node (a3) increases due to capacitance coupling of the capacitor (Cp2).

With diode-connected transistors like the transistor (Tr8), the source voltage is attenuated from the drain voltage by the threshold voltage (Vth) amount, and thus sufficient voltage is not obtained. However, this voltage increase makes it possible to prevent voltage attenuation of the node (a2) in the next-level circuit A.

The voltage of the node (a4) is transmitted to the node (a5) via the transistor (Tr9) and is output via the transistors (Tr17, Tr18) to the node (a6), which is connected to the output terminal of the previous level (for example, the terminal from which the second shift pulse of ND2 is output) and to the output terminal of the same level (for example, the terminal from which the first shift pulse of ND3 is output). The H-level second shift pulse of ND2 from the output terminal of the previous level and the H-level first shift pulse of ND3 from the output terminal of the same level are accordingly output. In addition, the transistors (Tr12, Tr13) assume an "on" state, and the second shift pulse output from the output terminal of the same level (for example, the terminal from which the second shift pulse of ND4 is output) changes to the L level.

On the other hand, since the voltage of the node (a3) is applied via the transistors (Tr6, Tr7) to the transistors (Tr1, Tr2) of the previous-level circuit A, the transistors (Tr1, Tr2) of the previous-level circuit A assume an "on" state, and the node (a2) of the previous-level circuit A changes to the L level.

The transistors (Tr10, Tr11) of the previous-level circuit A accordingly assume an "off" state, and the voltage of the node (a5) in the same level is applied to the transistor (Tr16) of the previous-level circuit A. Accordingly, the transistor (Tr16) of the previous-level circuit A assumes an "on" state, and the first shift pulse output from the output terminal of the previous-level circuit A (for example, the terminal from which the first shift pulse of ND1 is output) changes to the L level.

As a result of the execution of the previously described operations by the circuit A in each level, the first shift pulse (ND1, ND3, ND5, . . . ) is output at times (t2, t4, t6, . . . ). Also, because the second shift pulse (ND2, ND4, ND6, . . . ) is output when the next-level circuit A is activated, the second shift pulse (ND2, ND4, ND6, . . . ) is output at times (t4, t6, t8, . . . ), and is maintained until the next frame.

In this embodiment, the drive method for the gate lines (G1, G2, . . . , Gn) can be selected from the methods shown in (1) below, and the AC drive method can be selected from the methods shown in (2) below.

(1) Gate Line Sequential Drive or Multiple Gate Line Simultaneous Drive (2) 1-Line Inversion AC Drive Method or Frame Inversion AC Drive Method The various drive methods are alternated in the scanning voltage generation circuit 11 and the common voltage generation circuit 12 shown in FIG. 2. The drive methods are described below.

(1) Gate Line Sequential Drive, with 1-Line Inversion AC Drive Method.

Figure 6:
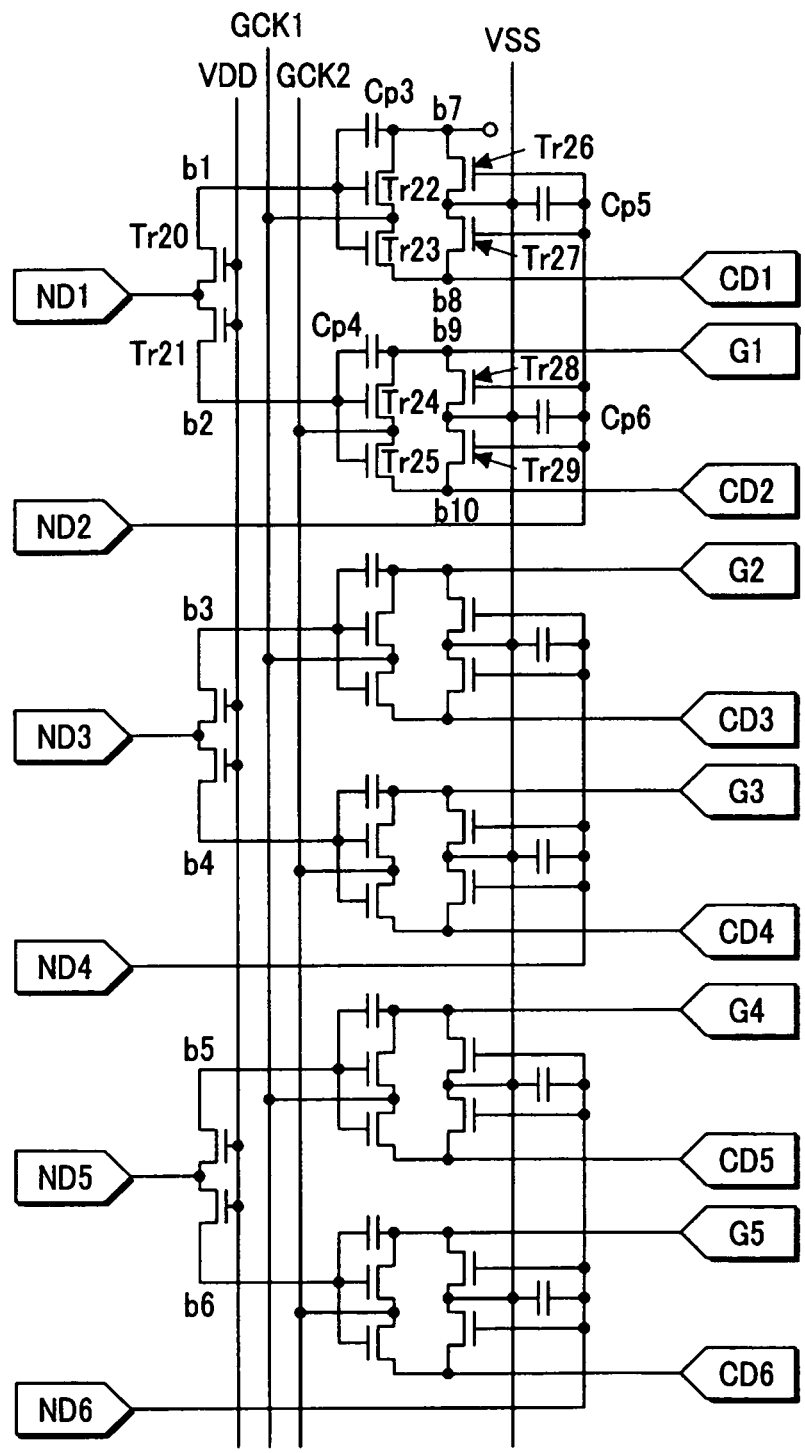
FIG. 6 is a circuit diagram showing the circuit configuration of circuits B as the base circuits in the scanning voltage generation circuit shown in FIG. 2.
Figure 7:
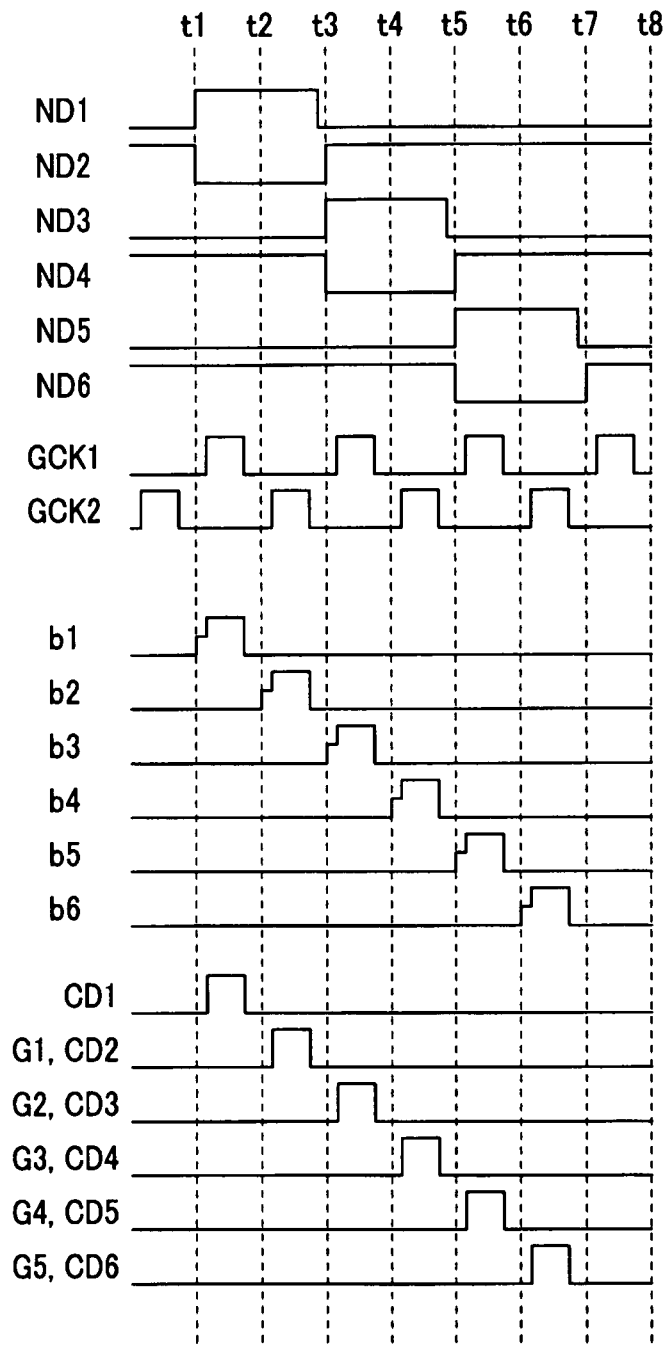
FIG. 7 is a timing chart showing the waveform of input signals and clocks input into the circuit in FIG. 6, and of output signals output from the circuit in FIG. 6.

FIG. 6 is a circuit diagram showing the circuit configuration of the circuits B, which are the base circuit in the scanning voltage generation circuit 11 shown in FIG. 2. FIG. 7 is a timing chart showing the waveform of input signals and clocks input into the circuit in FIG. 6 and output signals output from the circuit in FIG. 6.

In FIGS. 6 and 7, clocks GCK1 and GCK2 are scanning line clocks. The H level for the scanning line clocks (GCK1, GCK2), for the first shift pulse (ND1, ND3, ND5, . . . ), and for the second shift pulse (ND2, ND4, ND6, . . . ) is set to the same potential as the power voltage of VDD.

The first shift pulse (ND1) is output to nodes (b1, b2) via transistors (Tr20, Tr21). But since the voltage decreases by the amount of the threshold value of the transistors (Tr20, Tr21), the transistors (Tr22 to Tr25) cannot adequately assume an "on" state.

In this embodiment, when the scanning line clocks (GCK1, GCK2) are applied to the source of the transistors (Tr22 to Tr25), the voltage of the nodes (b1, b2) is increased due to capacitance coupling of capacitors (Cp3, Cp4). In addition, when the voltage of the nodes (b1, b2) is not equal to that of the first shift pulse of ND1, the transistors (Tr20, Tr21) assume an "off" state and the nodes (b1, b2) go into a floating state in order for the source and gate voltages to be equalized.

The voltage of the nodes (b1, b2) is accordingly increased to a level that is equal to or greater than the H-level voltage of the scanning line clocks (GCK1, GCK2).

According to the present embodiment, the voltage of the nodes (b1, b2) is thereby raised to a level that is equal to or higher than the H-level voltage of the scanning line clocks (GCK1, GCK2). As shown in FIG. 7, the transistors (Tr22 to Tr25) can adequately assume an "on" state. It is also possible to use floating capacitance between the gates and drains of the transistors (Tr22 to Tr25) in place of capacitors (Cp3, Cp4).

When the scanning line clocks (GCK1, GCK2) are input at the times shown in FIG. 7, then in circuits B1 and B2 the scanning line clock (GCK1, GCK2) signals are output to nodes (b7 to b10) only for the interval while the first shift pulse of ND1 is output.

The voltage of the node (b8) is output as the common electrode drive pulse (CD1) supplied to the common voltage generation circuit 12, while the voltage of the node (b9) is output as the selected scanning voltage supplied to gate line (G1), and the voltage of the node (b10) is output as the common electrode drive pulse (CD2) supplied to the common voltage generation circuit 12, all with the timing shown in FIG. 7.

When the selected scanning voltage is output to the gate line (G1), the gate turns the pixel transistor (TFT) connected to gate line (G1) on for one horizontal scan interval. The same operation is performed from the gate line (G3) and thereafter as well.

As shown in FIG. 7, when the second shift pulse of ND2 is output with the same timing as the first shift pulse of ND3, transistors (Tr26 to Tr29) assume an "on" state at the time t3, and the nodes (b7 to b10) go to L level. This voltage is maintained until voltage is applied again to the nodes (b1, b2) from capacitors (Cp5, Cp6).

The above operations are performed at each stage in the circuit B. The selected scanning voltage is output to the gate lines (G1 to G5), and the common electrode drive pulses CD1 to CD6 are output to the common voltage generation circuit 12, both at the times shown in FIG. 7.

Figure 8:
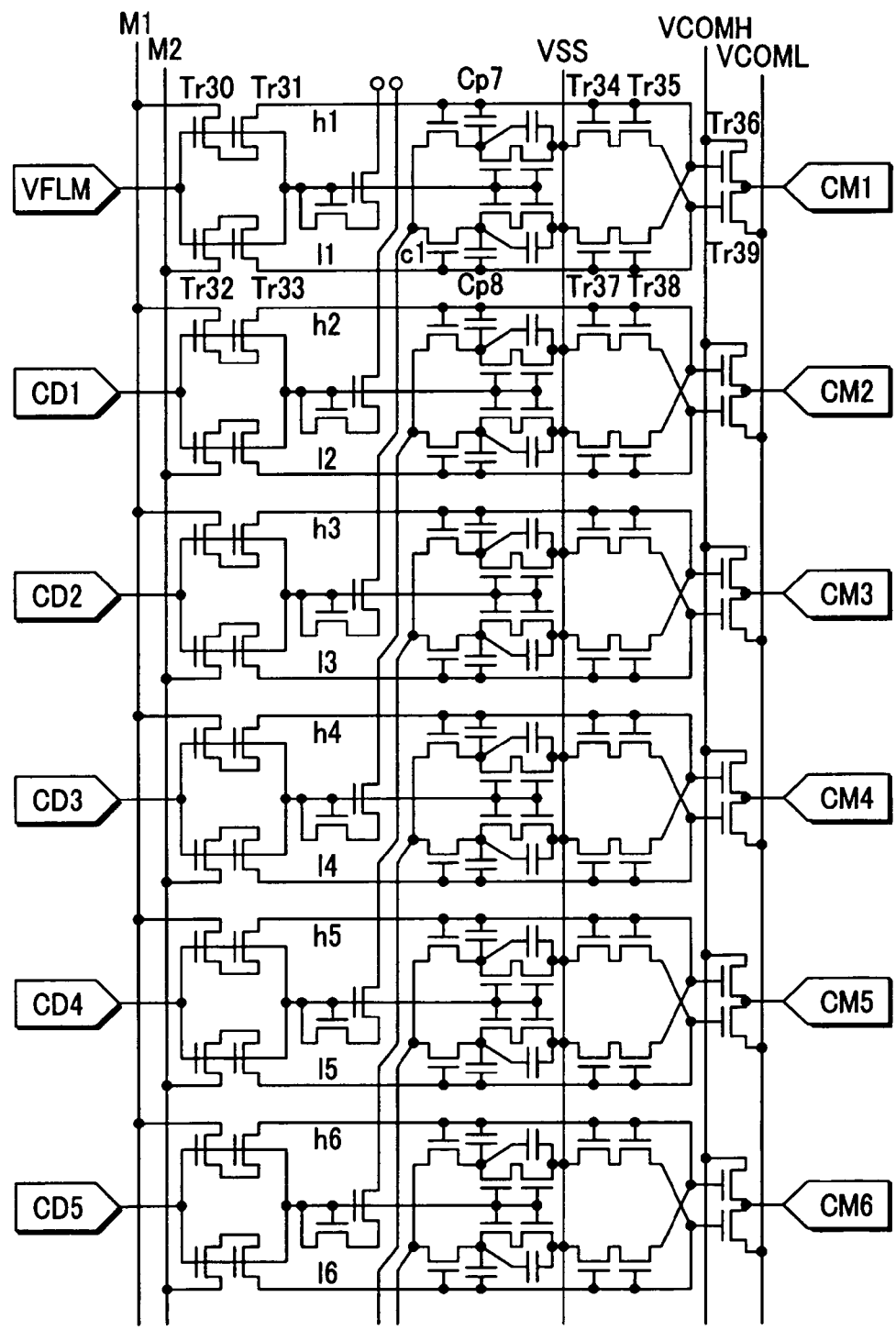
FIG. 8 is a circuit diagram showing the circuit configuration of circuits C as the base circuits in the common voltage generation circuit shown in FIG. 2.
Figure 9:
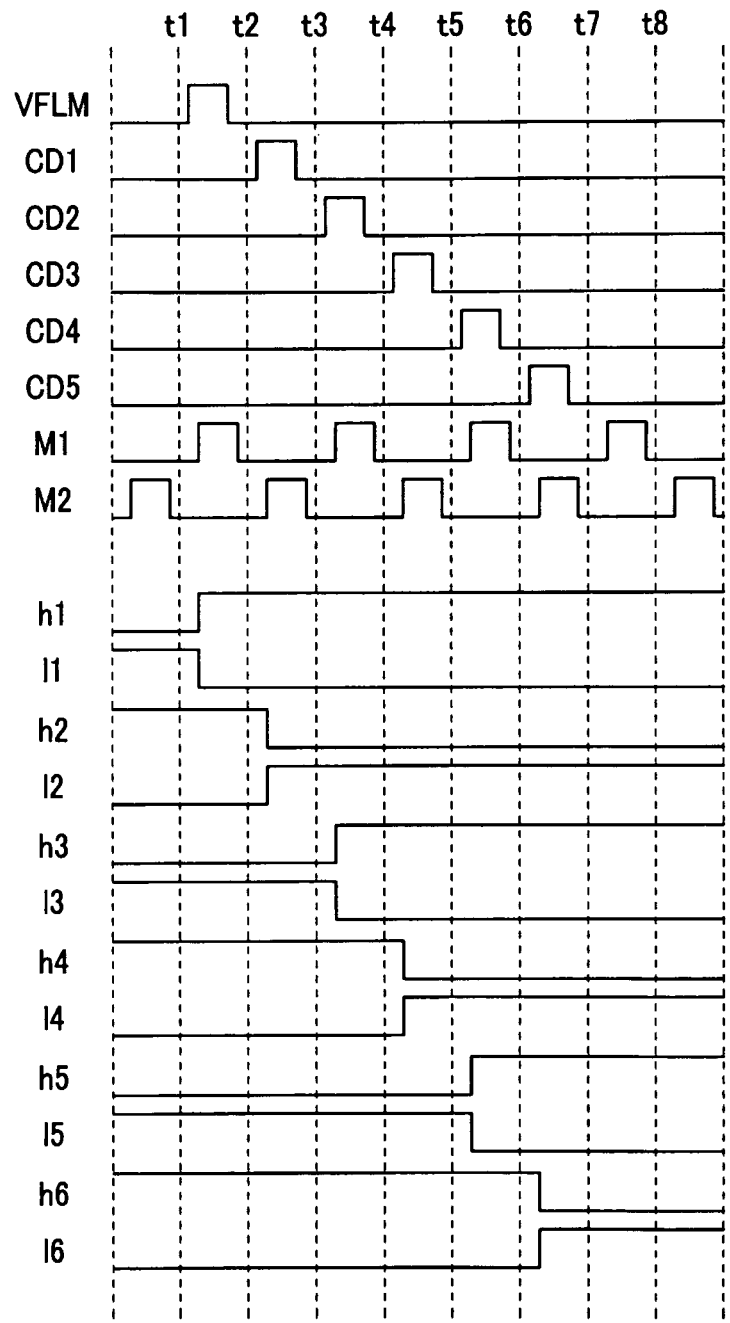
FIG. 9 is a timing chart showing the waveform of input signals input into the circuit in FIG. 8, and of the voltage for each node in the circuit in FIG. 8.

FIG. 8 is a circuit diagram showing the circuit configuration of a circuit C, the base circuit of the common voltage generation circuit 12 shown in FIG. 2. FIG. 9 is a timing chart showing the waveform of input signals input into the circuit in FIG. 8 and the voltage of the nodes in the circuit in FIG. 8. In FIGS. 8 and 9, M1 and M2 are AC signals.

When a vertical start pulse (VFLM) is input to a circuit C1 in the common voltage generation circuit 12, transistors (Tr30 to Tr33) assume an "on" state, and the AC signal (M1) simultaneously changes to the H level when the transistors (Tr30 to Tr33) assume an "on" state, as shown in FIG. 9. H-level voltage is applied to the gates of transistors (Tr34 to Tr36), and transistors (Tr34 to Tr36) assume an "on" state.

The node (11) accordingly changes to the L level, and a transistor (Tr39) therefore assumes an "off" state. In addition, since the transistor (Tr36) assumes an "on" state, the voltage of VCOMH is output to the common line of CM1.

Next, when the common electrode drive pulse (CD1) output from circuit B1, which is a base circuit of the scanning voltage generation circuit 11, is input to a circuit C2 in the common voltage generation circuit 12, a node (12) changes to the H level, and the voltage of VCOML is output to the common line of CM2. This procedure is the reverse of that in the previous level.

Next, when the common electrode drive pulse (CD2) output from the circuit B2, which is a base circuit in the scanning voltage generation circuit 11, is input to a circuit C3 in the common voltage generation circuit 12, a node (13) changes to the H level, and the voltage of VCOMH is output to the common line of CM3. This procedure is the reverse of that in the previous level. At the same time, the common electrode drive pulse (CD2) sets the node (c1) of the circuit in the second previous level to the H level.

The nodes (h) and the nodes (1) in circuit C at each stage in the common voltage generation circuit 12 change from the H level to the L level, or from the L level to the H level, at the times shown in FIG. 9. After changing to the L level, the node (11) goes into a floating state. Accordingly, voltage is applied due to the effect of capacitance coupling in the transistor (Tr36), and the transistors (Tr37, Tr38) assume a semi-"on" state. When this occurs, the transistor (Tr36) also goes into a semi-"on" state, and the desired voltage cannot be obtained.

Therefore, by applying voltage to the node (c1) from circuit C in the second following stage, a capacitor (Cp7) is used to increase voltage. A voltage at or above the voltage of VDD is accordingly applied to the gate of the transistor (Tr36), whereby the transistor (Tr36) can be adequately made to assume an "on" state.

In this manner, the circuit C1, which has initiated driving via the common electrode drive pulse (CD1), outputs the desired common voltage of VCOMH to the common line using the common voltage pulse (CD3).

As shown in FIG. 2, in order to input the picture voltage to the pixel electrodes (PX) in the n display lines, the selected scanning voltage output to the gate lines in the n display lines is output from the circuit B(n+1) at level (n+1). At the same time, circuit C(n+2) at level (n+2) is activated, and the common voltage is output from the circuit Cn in level n.

Figure 10:
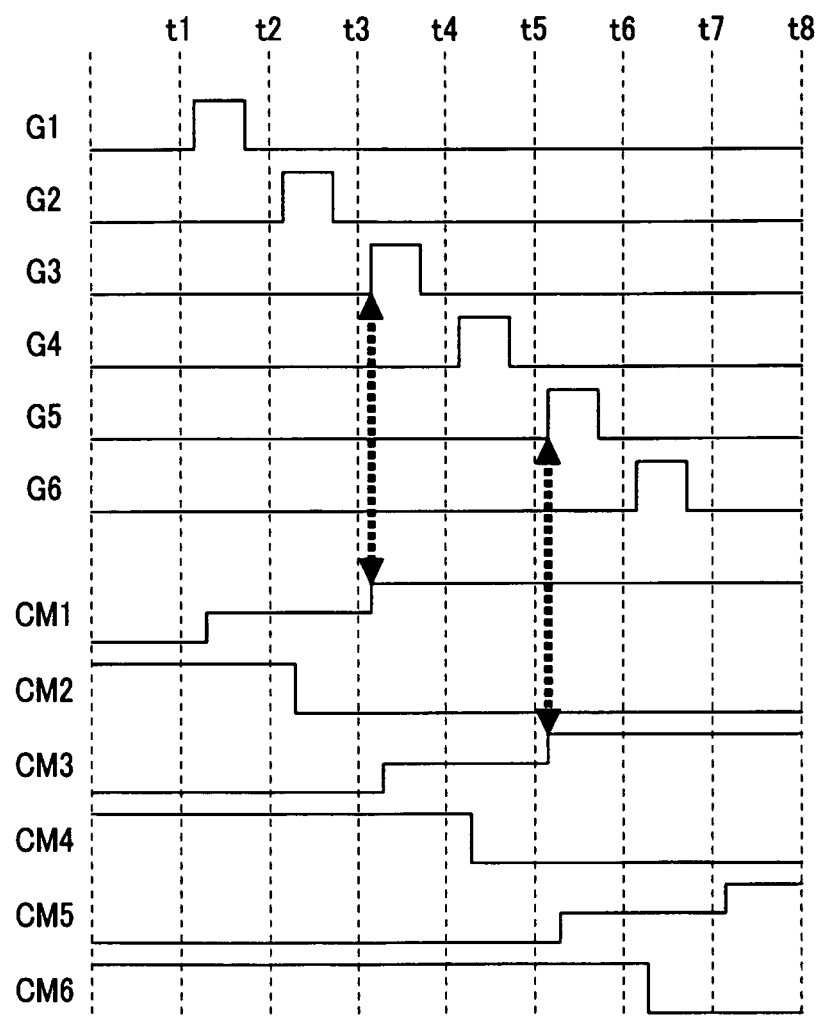
FIG. 10 is a diagram showing the timing of gate voltage and common voltage output in an embodiment of this invention.

The time at which the gate voltage and the common voltage are output is shown in FIG. 10. Since the gate voltage and the common voltage cannot be applied simultaneously to the pixel electrodes (PX), the desired drive voltage is not applied to the liquid crystal during the interval while the node (h) and the node (l) are in a floating state, while the desired drive voltage is applied to the liquid crystal with the timing shown by the arrows in the drawing.

Figure 11:
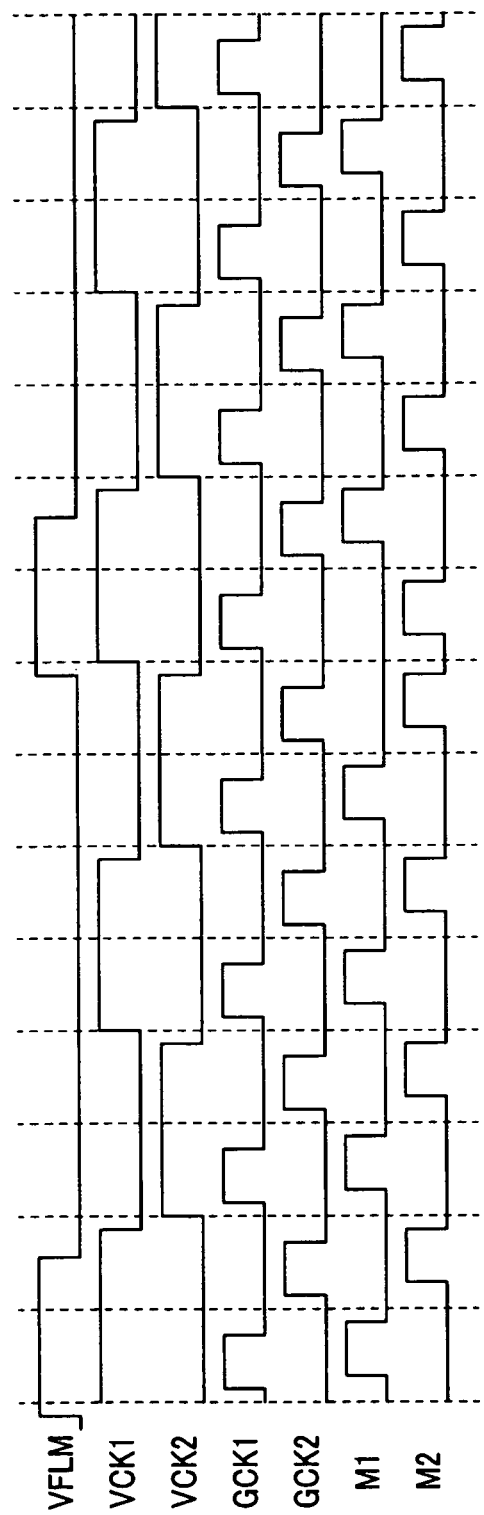
FIG. 11 is a diagram showing the waveform of a vertical start pulse (VFLM), shift clocks (VCK1, VCK2), scanning line clocks (GCK1, GCK2), and AC signals (M1, M2) in the case when the 1-line inversion AC drive method is employed under gate line sequential drive.

FIG. 11 shows the waveforms of the vertical start pulse (VFLM), the shift clocks (VCK1, VCK2), the scanning line clocks (GCK1, GCK2) and the AC signals (M1, M2) in the case in which the 1-line inversion AC drive method is employed, when the resolution of the liquid crystal display panel is VGA (640×3×480); i.e., when there are 480 display lines.

Figure 12:
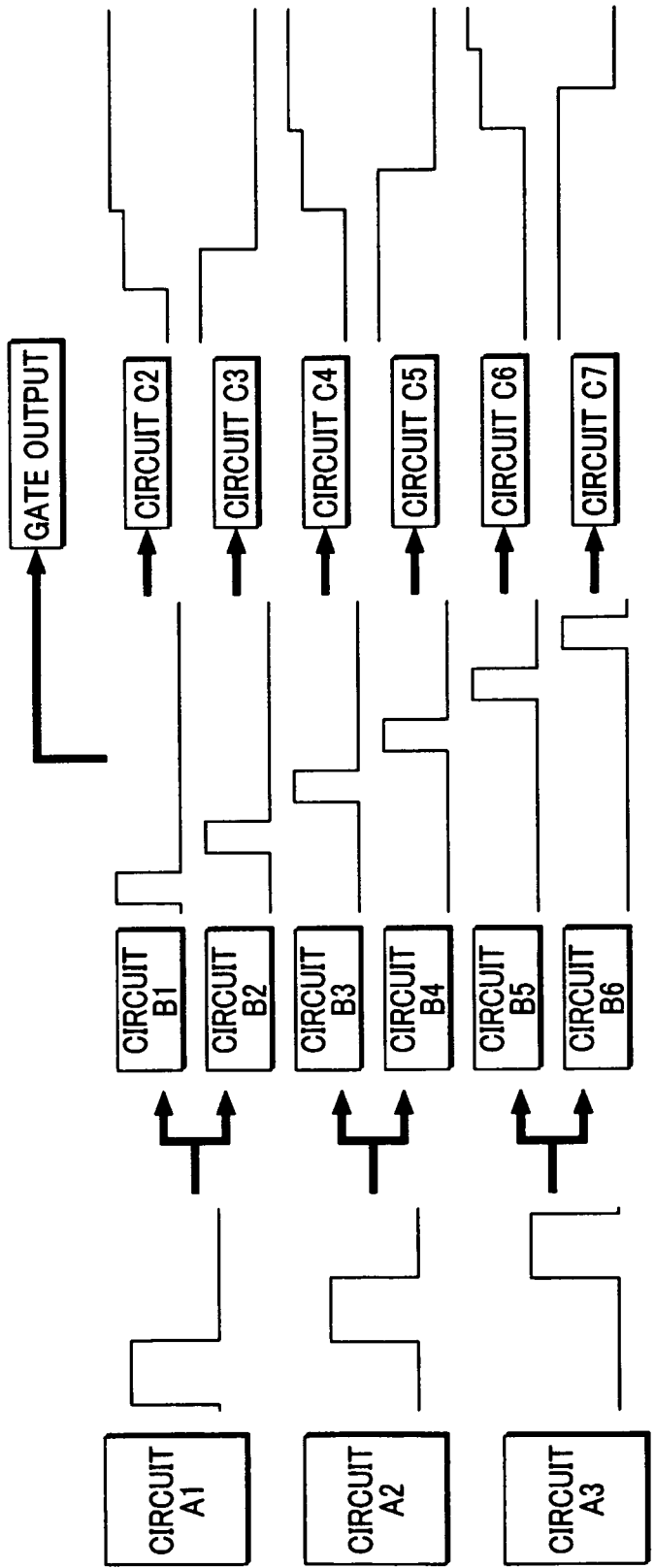
FIG. 12 is a diagram showing a selected scanning voltage applied to the gate line and the common voltage applied to the common line in the case when the 1-line inversion AC drive method is employed under gate line sequential drive.

As is apparent from FIG. 11, AC signals (M1, M2) are inverted in every frame. FIG. 12 illustrates the selected scanning voltage applied to the gate lines and the common voltage applied to the common lines. As is apparent from FIG. 12, the common voltage of VCOMH and the common voltage of VCOML are applied in alternating order to each common line.

(2) Gate Line Sequential Drive, with the Frame Inversion AC Drive Method.

Figure 13:
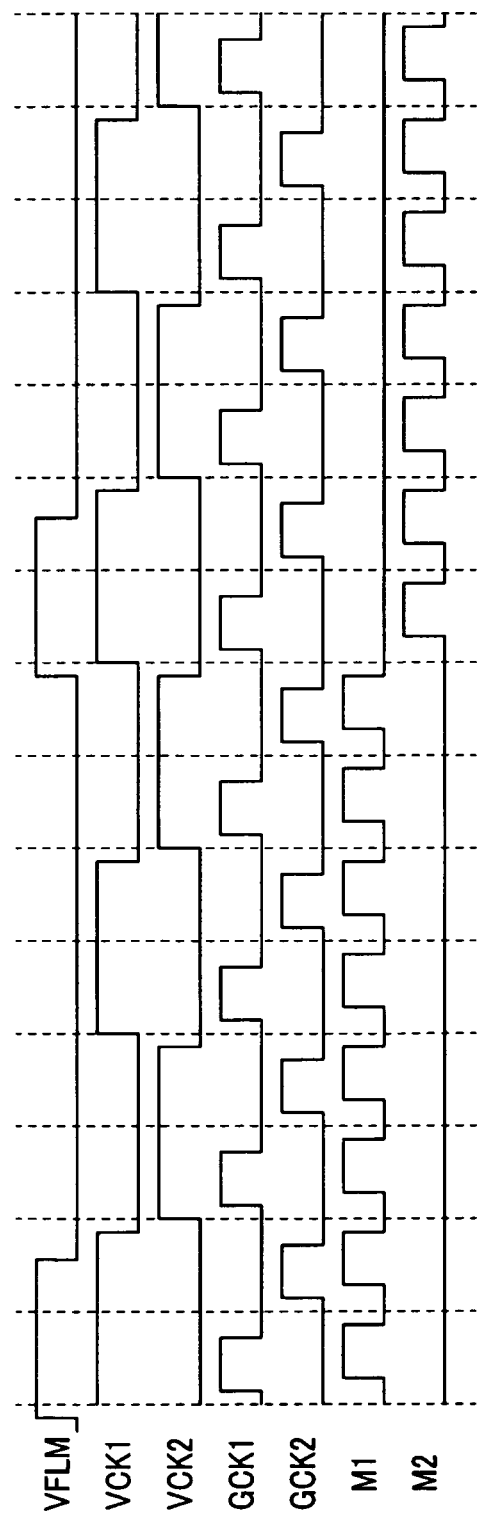
FIG. 13 is a diagram showing the waveform of a vertical start pulse (VFLM), shift clocks (VCK1, VCK2), scanning line clocks (GCK1, GCK2), and AC signals (M1, M2) in the case when the frame inversion AC drive method is employed under gate line sequential drive.
Figure 14:
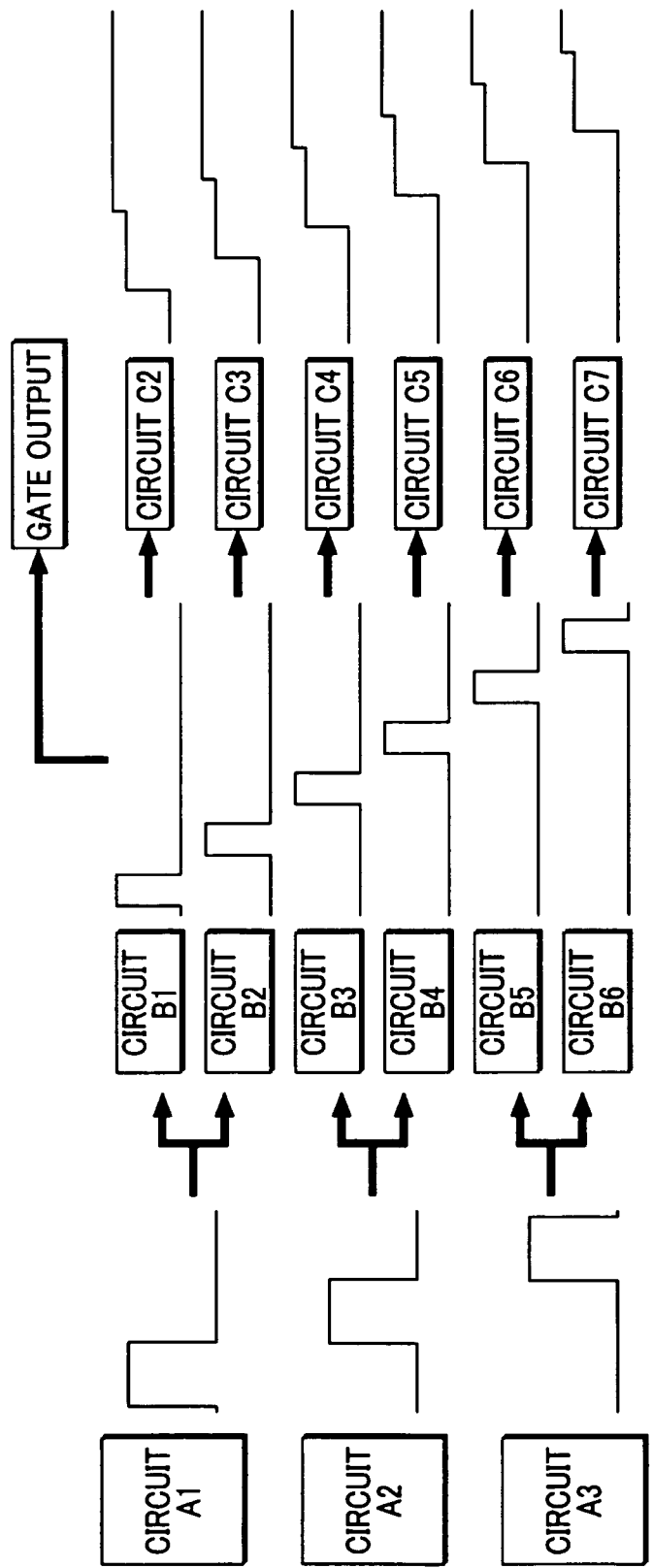
FIG. 14 is a diagram showing the selected scanning voltage applied to the gate line and the common voltage applied to the common line in the case when the frame inversion AC drive method is employed under gate line sequential drive.

When the gate line sequential drive method is applied, the signals shown in FIG. 13 are input as AC signals (M1, M2). Since H-level voltage is constantly applied from the AC signal (M1) to the node (h) in the circuit C in each level in the common voltage generation circuit 12, only the common voltage of VCOMH is output to all gate lines, as shown in FIG. 14.

In the next frame, the phases of the AC signal (M1) and the AC signal (M2) are inverted, and only the common voltage of VCOML is output to all gate lines.

(3) Multiple Gate Line Simultaneous Drive, with the 1-Line AC Drive Method.

Figure 15:
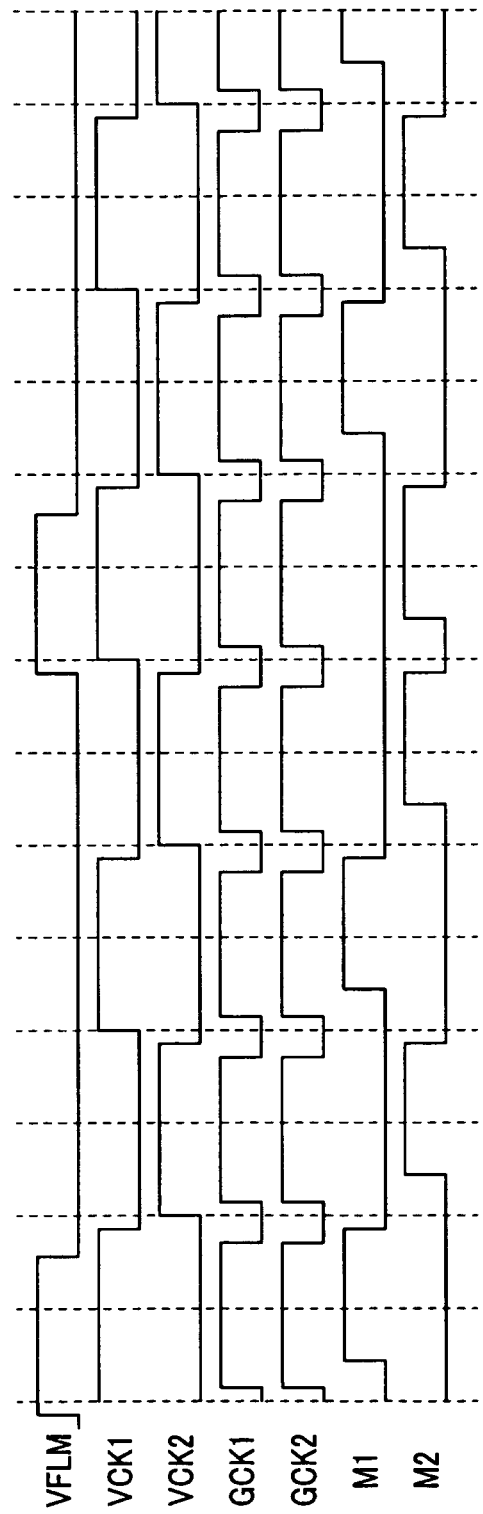
FIG. 15 is a diagram showing the waveform of a vertical start pulse (VFLM), shift clocks (VCK1, VCK2), scanning line clocks (GCK1, GCK2), and AC signals (M1, M2) in the case when the 1-line inversion AC drive method is employed under multiple gate line simultaneous drive.

In the case of this drive method, the clocks and signals shown in FIG. 15 are input as the scanning line clocks (GCK1, GCK2) and the AC signals (M1, M2).

When the scanning line clock (GCK1) and the scanning line clock (GCK2) are rendered as clocks with the same phase, then when the first shift pulse (ND3) is input to the circuit shown in FIG. 6, the transistors (Tr20, Tr21) simultaneously assume an "on" state, and the selected scanning voltage is output to the gate line (G2); and the selected line voltage, the common electrode drive pulse (CD3), and the common electrode drive pulse (CD4) are output to the gate line (G3), at the same time from the two circuits B (circuit B3, circuit B4) into which the first shift pulse (ND3) is input.

Since the signal shown in FIG. 15 is also input as the AC signal (M1), two common electrode drive pulses (for example, common electrode drive pulses CD1 and CD2) are output, and simultaneously the VCOMH common voltage is output to common line (CM2) and common line (CM3).

Figure 16:
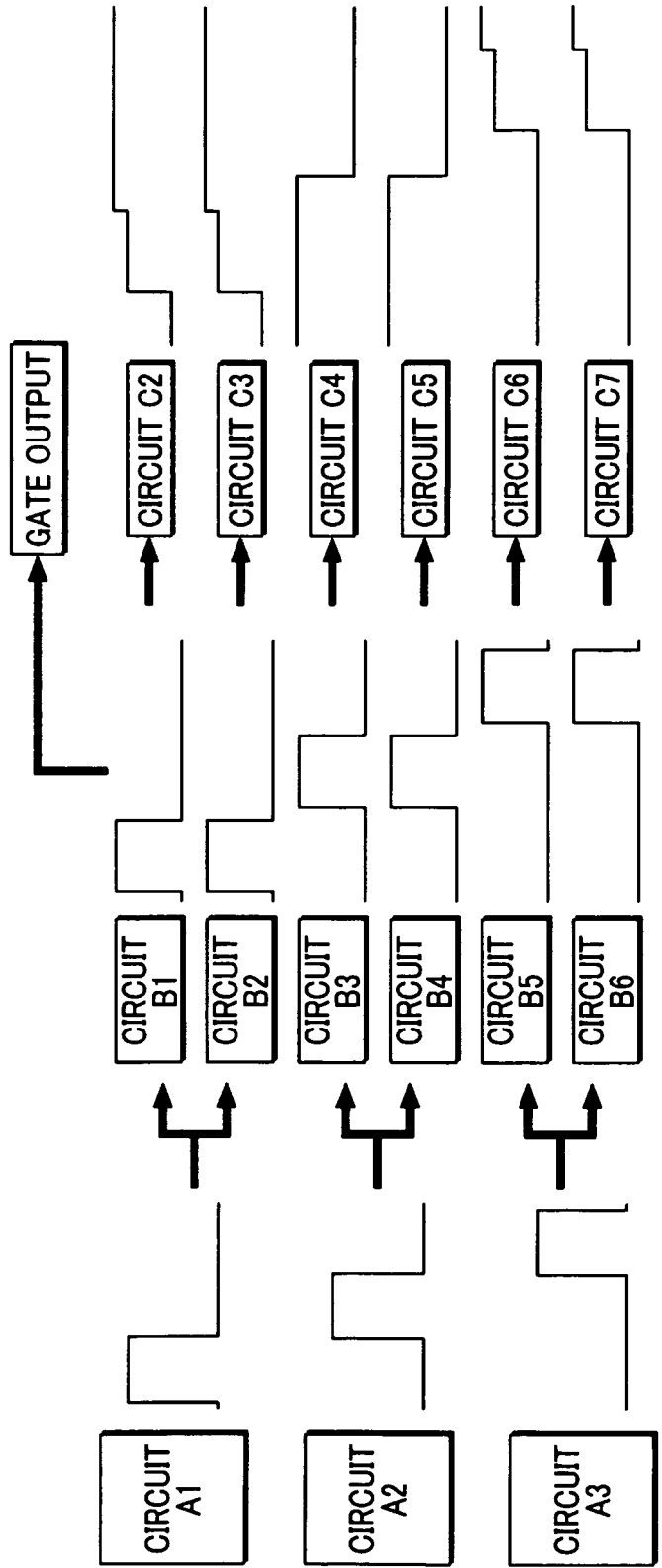
FIG. 16 is a diagram showing the selected scanning voltage applied to the gate line and the common voltage applied to the common line in the case when the 1-line inversion AC drive method is employed under multiple gate line simultaneous drive.

In the next frame, the phases of the AC signal (M1) and the AC signal (M2) are inverted, and the VCOML common voltage is simultaneously output to the common line (CM2) and the common line (CM3). As shown in FIG. 16, the common voltage of VCOMH and the common voltage of VCOML are output in alternating sequence to the common lines, two lines at a time.

(4) Multiple Gate Line Drive, with Frame Inversion AC Drive Method.

Figure 17:
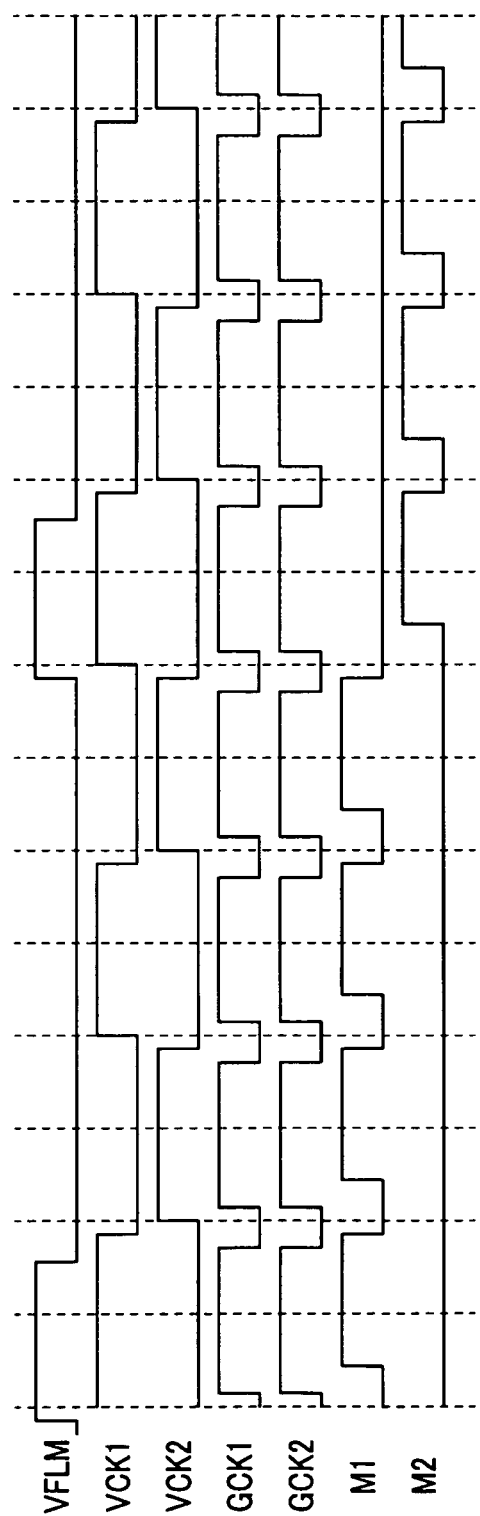
FIG. 17 is a diagram showing the waveform of a vertical start pulse (VFLM), shift clocks (VCK1, VCK2), scanning line clocks (GCK1, GCK2), and AC signals (M1, M2) in the case when the frame inversion AC drive method is employed under multiple gate line simultaneous drive.

In the case of this drive method, the clocks and signals shown in FIG. 17 are input as the scanning line clocks (GCK1, GCK2) and AC signals (M1, M2).

The scanning line clock (GCK1) and scanning line clock (GCK2) are clocks with the same phase. Since H-level voltage is constantly applied from the AC signal (M1) to the node (h), the common voltage of VCOMH is simultaneously output to every two common lines, as shown in FIG. 18.

In the next frame, the phases of the AC signal (M1) and the AC signal (M2) are inverted, and the common voltage of VCOML is output simultaneously to every two common lines.

In the foregoing description, two circuits B from the scanning voltage generation circuit 11 are connected to the circuit A in the shift register circuit 10. However, if three or four were connected, it would be possible to simultaneously switch three display lines or four display lines.

In the case in which three circuits B from the scanning voltage generation circuit 11 are connected to the circuit A in the shift register 10, a scanning line clock GCK3 and an AC signal M3 are added, and the clocks and signals shown in FIG. 19 are input as the scanning line clocks (GCK1, GCK2, GCK3) and the AC signals (M1, M2, M3). As an example of this application, it would be possible to switch between full-screen simultaneous display and a three-window simultaneous display in a triple-view panel.

In the foregoing description, a case was described in which the vertical drive circuit was composed of type n thin film transistors. However, in this embodiment, not only a MOS single-channel configuration which consists of n-type thin film transistors, but also a pMOS single-channel configuration which consists of p-type thin film transistors is possible. In this case, the VSS reference voltage is H level, and the logic is inverted.

Furthermore, in the foregoing description, a case was described in which a MOS (metal oxide semiconductor) TFT was used as a transistor. However, it is also possible to use a standard MOS-FFT or an MIS (metal insulator semiconductor) FET.

As described above, according to the vertical drive circuit in this embodiment, since it is possible to configure circuitry with either n or p type single-channel elements, it is possible to use fewer steps in the manufacturing process compared to the case in which the scanning line drive circuit is configured as a CMOS circuit, as described in the previously mentioned JP-A 2004-252092. Accordingly, it is possible to reduce costs.

In addition, in this embodiment, altering the phases of n (e.g., two) scanning line clocks makes it possible to switch between driving gate lines in a simultaneous plurality or one-by-one in sequence. Moreover, altering the phases of n (e.g., two) AC signals makes it possible to switch between the 1-line inversion AC drive method and the frame inversion AC drive method.

Since it is possible to select among a plurality of drive methods (for example, a drive method supporting VGA resolution, and a drive method supporting QVGA) for the vertical drive circuit in this embodiment, the vertical drive circuit in this embodiment can thus be applied to many types of liquid crystal display panels. It is accordingly possible to increase the field of utilization, streamline the manufacturing process, and contribute to improving product quality and efficiency.

In the foregoing description, an embodiment was described in which this invention was applied to a liquid crystal display module using an IPS liquid crystal display panel; however, this embodiment is not provided by way of limitation. The invention may also be applied to a liquid crystal display module using a VA or other vertical electrical field method liquid crystal display panel. Furthermore, in the foregoing description, an embodiment was described in which this invention was applied to a liquid crystal display module; however, this embodiment is not provided by way of limitation. This invention can also be applied to an EL display device using organic EL elements, and the like.

While there have been described what at present are considered to be certain embodiments of the invention, it will be understood that various modifications may be made hereto, and it is intended that the appended claims cover all such embodiments as fall within the true spirit and scope of the invention.

What is claimed is:

1. A display device comprising:
a plurality of pixels;
a plurality of scanning lines; and
a plurality of common lines;
a scanning line drive circuit; and
a common line drive circuit; wherein
the scanning line drive circuit has a shift register circuit and a scanning voltage generation circuit for generating a scanning voltage;
the shift register circuit has a plurality of shift pulse generation circuits for generating a first shift pulse and second shift pulse;
the scanning voltage generation circuit has a plurality of base circuits;
each one of the shift pulse generation circuits corresponds to n of the base circuits and provides shift pulse inputs to drive n gate lines, where n is an integral number of 2 or greater;
the first shift pulse and the second shift pulse generated by the shift pulse generation circuit and corresponding to each of the plurality of base circuits are input into the each of the plurality of base circuits in the scanning voltage generation circuit;
first through nth scanning line clocks are input into the plurality of base circuits, wherein a first scanning line clock is input to a respective first base circuit of the scanning voltage generation circuit and an nth scanning line clock is input to a respective nth base circuit of the scanning voltage generation circuit;
each of the plurality of base circuits in the scanning voltage generation circuit respectively has:
a first transistor including a first electrode to which the first shift pulse generated by the shift pulse generation circuit provided in the shift register circuit is input, a control electrode to which a fixed first power supply voltage is input and a second electrode, and
a second transistor including a control electrode connected to the second electrode in the first transistor, a first electrode to which one of the first through nth scanning line clocks is input, and a second electrode connected to a scanning voltage output terminal;
each of the plurality of base circuits outputs a selected scanning voltage synchronized with inputting one of the first through nth scanning line clocks from the scanning voltage output terminal when the first shift pulse that has been input is at a first voltage level, wherein
the first through nth scanning line clocks are inputted having at least one of mutually different phases relative to each other and identical phases relative to each other in response to a selection of at least one of a gate line sequential drive method and a multiple gate line drive method of the plurality of pixels, and the common line drive circuit determines an AC drive method of the plurality of pixels,
wherein the first through nth scanning line clocks have mutually different phases relative to each other in response to a selection of the gate line sequential drive method and the first through nth scanning line clocks have identical phases relative to each other in response to a selection of the multiple gate line drive method.

2. The display device of claim 1, comprising a first capacitor between the control electrode of the second transistor and the second electrode of the second transistor.

3. The display device of claim 1, wherein
each of the shift pulse generation circuits in the shift register circuit generate a second shift pulse whose phase differs from that of the first shift pulse;
the base circuits in the scanning voltage generation circuit further have:
a third transistor including a control electrode to which the second shift pulse generated by the shift pulse generation circuit provided in the shift register circuit is input, a first electrode to which a second power supply voltage having a voltage level that is different from that of the first power supply voltage is input, and a second electrode is connected to the scanning voltage output terminal, and
a second capacitor connected between the control electrode of the third transistor and the first electrode of the third transistor; and
each of the base circuits keep potential of the scanning voltage output terminal at the voltage level of the second power supply voltage when the second shift pulse that has been input is at the first voltage level.

4. The display device of claim 1, wherein
the scanning line drive circuit has a common voltage generation circuit for presenting each of common electrodes with a first common voltage or a second common voltage having a voltage level that differs from that of the first common voltage, on the basis of a common electrode drive pulse output from each of the base circuits of the scanning voltage generation circuit;

the base circuits of the scanning voltage generation circuit further have a fourth transistor in which a control electrode is connected to the control electrode of the second transistor, a first electrode is connected to the first electrode of the second transistor, and a second electrode is connected to a common electrode drive pulse output terminal; and each of the base circuits outputs the common electrode drive pulse synchronized to an inputted one of the first through nth scanning line clocks from the common electrode drive pulse output terminal when the first shift pulse that has been input is at the first voltage level.

5. The display device of claim 3, wherein the scanning line drive circuit has a common voltage generation circuit for presenting each of common electrodes with a first common voltage or a second common voltage having a voltage level that differs from that of the first common voltage, on the basis of a common electrode drive pulse output from each of the base circuits of the scanning voltage generation circuit;

the base circuits of the scanning voltage generation circuit further have:

a fourth transistor including a control electrode connected to the control electrode of the second transistor, a first electrode connected to the first electrode of the second transistor, and a second electrode connected to a common electrode drive pulse output terminal; and a fifth transistor including a control electrode connected to the control electrode of the third transistor, a first electrode connected to the first electrode of the third transistor, and a second electrode connected to the common electrode drive pulse output terminal; and each of the base circuits outputs the common electrode drive pulse synchronized to an inputted one of the first through nth scanning line clocks from the common electrode drive pulse output terminal when the first shift pulse that has been input is at the first voltage level, and hold the potential of the common electrode drive pulse output terminal at the voltage level of the second power voltage when the second shift pulse that has been input is at the first voltage level.

6. The display device of claim 3, wherein a point at which the first shift pulse rises (or falls) is aligned with a point at which the second shift pulse falls (or rises); and the point at which the first shift pulse falls (or rises) differs from the point at which the second shift pulse rises (or falls).

7. The display device of claim 1, wherein the base circuits sequentially output a selected scanning voltage to the scanning lines corresponding to the base circuits.

8. The display device of claim 1, wherein the base circuits in the scanning voltage generation circuit simultaneously output a selected scanning voltage to the scanning lines corresponding to the base circuits.

9. The display device of claim 4, wherein common voltage generation circuits which belong to one of first through nth categories in the shift register circuit;

first to nth scanning line clocks are respectively input into the base circuits which belong to the first through nth categories;

first to nth AC signals are input respectively into the n common voltage generation circuits which belong to the first through nth categories; and the common voltage generation circuit which belongs to nth category has:

a circuit C1 for taking in the nth AC signal on the basis of the common electrode drive pulse output from the nth base circuit in the scanning voltage generation circuit, and a circuit C2 for outputting the first common voltage or the second common voltage to a common electrode corresponding to the corresponding one of the common voltage generation circuits on the basis of the AC signal taken in by the circuit C1.

10. The display device of claim 9, wherein the base circuits in the scanning voltage generation circuit sequentially output a selected scanning voltage to scanning lines corresponding to the base circuits;

the first to nth AC signals are signals having mutually different phases; and the common voltage generation circuits alternatingly output the first common voltage and the second common voltage to the respective common electrodes.

11. The display device of claim 9, wherein the base circuits in the scanning voltage generation circuit simultaneously output a selected scanning voltage to the scanning lines corresponding to the n base circuits;

the first to nth AC signals are signals having mutually different phases; and the common voltage generation circuits output voltages to the respective common electrodes so that each groups of common electrodes have input of one of the first common voltage and the second common voltage.

12. The display device of claim 9, wherein the first through nth AC signals are signals having mutually different phases;

the first through nth AC signals include at least one signal having a different cycle; and the common voltage generation circuits output the first common voltage and the second common voltage alternatingly for each frame to the respective common electrodes.

* * * * *